GROWING AND DETERMINING EPITAXIAL LAYER THICKNESS

Filed Sept. 9, 1960

INVENTORS W. G. SPITZER
M. TANENBAUM
BY George S. Indig
ATTORNEY

United States Patent Office 3,099,579

Patented July 30, 1963

3,099,579

GROWING AND DETERMINING EPITAXIAL LAYER THICKNESS

William G. Spitzer, Plainfield, and Morris Tanenbaum, Madison, N.J., assignors to Bell Telephone Laboratories, Incorporated, New York, N.Y., a corporation of New York Filed Sept. 9, 1960, Ser. No. 54,872
9 Claims. (Cl. 117—230)

This invention relates to a nondestructive method for determining the thickness of an epitaxially grown film of a lightly doped semiconductor material on a heavily doped semiconductor substrate.

It has recently been shown by Kleimack et al. in copending application Serial No. 35,152, filed June 10, 1960, that transistors with desirable characteristics can be fabricated by combining conventional diffusion techniques with the process of growing thin, epitaxial layers of a lightly doped semiconductor material on a heavily doped material of the same type. The term epitaxial as used herein refers to layers deposited on a semiconductor crystal substrate which grow with the crystalline orientation of the substrate.

Typically, in accordance with techniques adapted for the growth of epitaxial layers, single crystal films, such as silicon, of high quality and controlled orientation are produced by preparing a surface of a heavily doped silicon wafer by mechanical or chemical surface treatment and then by depositing on this surface an epitaxial silicon film produced by the hydrogen reduction of a silicon compound, for example, silicon tetrachloride. Generally this film is produced under conditions such as to result in its evidencing higher resistivity than the substrate.

Following the deposition of the epitaxial layer, a diffused transistor is prepared by diffusing in base and emitter regions. Since the thickness of the diffused and undiffused regions are elemental in determining frequency response and other operating characteristics, the depth or diffusion must be closely controlled. In order to avoid complete penetration of the epitaxial layer by the diffusing impurity it is essential to control the diffusant. Thus, it becomes necessary to determine the thickness of the epitaxial layer so the appropriate degree of diffusion can be performed.

By varying the duration and temperature during the epitaxial growth process, the thickness of the epitaxial layer may be controlled. However, at present this technique is not sufficiently precise and it often becomes necessary to measure the thickness of the epitaxial layers before the diffusion operation. Heretofore, this has been done by (*a*) weighing procedures or (*b*) angle-lapping. The former consists of weighing a sample of single crystal semiconductor material before and after the growth of the layer and in such fashion determining the average layer thickness. This method fails to provide direct information concerning thickness gradients and furthermore suffers from inaccuracy due to growth on the back and sides of the sample. The latter method consists of angle-lapping the sample and determining the position of the junction between the layer and substrate by staining techniques. This procedure is destructive since the angle-lapped portion of the sample can no longer be used and, in addition, the staining etches used to delineate the high resistivity layers are oftentimes not completely discriminatory.

In accordance with this invention, the thickness of thin epitaxially grown films of semiconductive material, on a single crystal semiconductor substrate, is determined by an interference technique. This technique is nondestructive and is found to be sufficiently precise for device purposes.

Interference fringes have long been used to determine the thickness of thin, transparent films on foreign substrates. However, in order to obtain transmission or reflection fringes, it is necessary to satisfy certain variables. Firstly, it is necessary that there be a suitable spectural range in which the layer is transparent and secondly, the substrate on which the layer is formed must manifest a dielectric constant different than that of the layer. For cases involving the growth of a semiconductor layer on a substrate of the same semiconductor material, it is quite simple to satisfy the first requirement but it would appear that the latter requirement is not met. However, the reflectivity of semiconductors in the infrared is a function of the carrier concentration, and the contribution by the free carriers to the electric susceptibility results in changes in the dielectric constant. The contribution to the susceptibility is negative and is proportional to the first power of the carrier concentration and the square of the wavelength. Therefore, interference fringes can be observed in reflection from a lightly doped upper epitaxial layer, which overlies a heavily doped substrate, and the onset of the fringes occurs at a wavelength governed by the carrier concentration of the heavily doped substrate. The spacing is governed by the thickness of the epitaxial layer with the customary interference formulae.

The suitability of interference methods for the measurement of thickness of epitaxial films of silicon or germanium is not apparent since these materials are not transparent to visible light and, furthermore, since the epitaxial layer is not a film in the usual sense, but is an extension of the crystal structure of the substrate.

Although pure silicon is transparent to light of wavelengths longer than about 1.1 microns, the transparency in this infrared region is a function of the purity of the silicon. Since free electrons or holes can interact with infrared radiation, heavily doped silicon is less transparent than the same material containing a lesser concentration of impurity, such interaction also causing changes in refractive index. Thus, from an optical standpoint, there is a discontinuity at the boundary between a lightly doped epitaxial layer and a heavily doped substrate. This discontinuity occurs because of an abrupt change in refractive index and for this reason infrared radiation, which is transmitted by the epitaxial layer, is partially reflected at the interface between the epitaxial layer and the substrate. Since there is a similar partial reflection at the surface of the epitaxial layer, a plurality of reflected beams are produced. Thus, depending upon the thickness of the epitaxial layer, the reflection from the layer yields maxima and minima at wavelengths determined by customary interference formulae, namely:

$$p\lambda=2\eta t \qquad (1)$$

$$p\lambda=\lambda/2=2\eta t \qquad (2)$$

where $p$ is an integer, 1, 2, etc., such value defining the order number of the interference fringes which occur, $\lambda$=the wavelength in free space of the incident radiation,
$\eta$=refractive index of the epitaxial layer,
$t$=thickness of the epitaxial layer.

Equation 1 above defines reflection minima whereas Equation 2 defines the reflection maxima. The theory upon which these equations are based as well as the theory of interference techniques may be found in "Fundamentals of Optics," by Jenkins and White, McGraw-Hill, 3rd Edition.

The full nature of the invention will be understood from the accompanying drawing and the following description and claims.

Figures 1, 2, 3, 4:
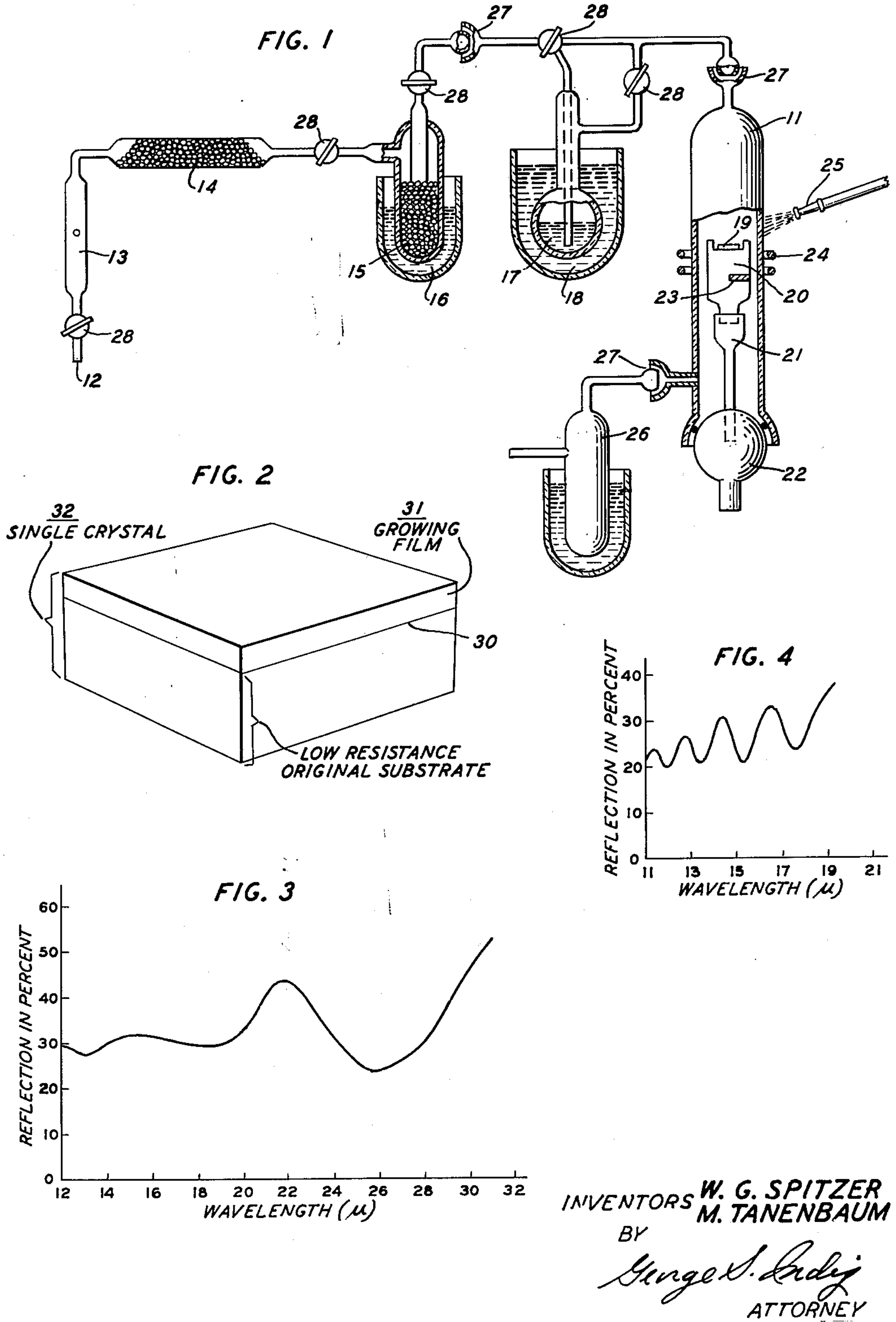
FIG. 1 is a front elevation view of one form of apparatus used for the growth of epitaxial films.
FIG. 2 is a front elevational view of a single crystal of silicon upon which there has been grown a thin, epitaxial film of silicon.
FIG. 3 is a graphical representation on co-ordinates of percent reflection against wavelength in microns showing interference fringes of a silicon sample.
FIG. 4 is a graphical representation on co-ordinates of percent reflection against wavelength in microns showing interference fringes of a germanium sample.

In a typical experiment, the equipment employed consists of a standard double pass single beam infrared spectrometer where the exit optical system has been designed for the purpose of making reflectivity measurements. This is accomplished by comparing energy incident to that reflected from the sample surface, the former being determined by substituting an aluminum mirror of known reflectivity for the sample.

The sample, such as an epitaxial film of silicon on a heavily doped silicon substrate of a resistivity different from that of the epitaxial layer, is placed in the spectrograph with the sample mount in the exit optics. Next, the series of monochromatic infrared beams of varying wavelengths, of the order of 1 to 30 microns is cast upon the sample, so causing the appearance of interference fringes due to the establishment of an optical interface between the substrate and the layer. Observation of the various maxima and minima of the fringes permits determination of the thickness of the epitaxial layer as discussed below.

Assuming that both the incident and reflected beams are perpendicular to the surface of the sample, interference fringes are observed whenever the layer thickness corresponds to one-half of the wavelength of the incident radiation in the silicon, the wavelength of the radiation in the silicon being different from the wavelength in free space if the refractive index of the silicon is other than unity. From these considerations it follows that a minimum in the reflected intensity occurs when:

$$t=\frac{\lambda}{2\eta}N \qquad (3)$$

where $t$=the thickness of the epitaxial layer,
$\lambda$=the wavelength in free space,
$\eta$=the refractive index of the epitaxial layer,
$N$=an integer with value 1, 2, . . .

with $t$ and $\lambda$ in the same units. From this relationship, one can determine the thickness of the layer directly if N, the order of the interference fringes, is known. If the order of the fringe is not known, the thickness of the layer is determined by observing two or more minima adjacent in wavelength. This technique has been applied to several epitaxially grown layers and is found to be consistent with other methods for determining the layer thickness.

The following description of a method for the growth of epitaxial layers on semiconductor substrates is typical of such techniques and is given by way of illustration and not limitation.

Referring more particularly to FIG. 1, the apparatus consists of a one inch I.D. quartz tube 11 about 12 inches long with inlet and outlet tubes for the introduction at atmospheric pressure of purified dried hydrogen and silicon tetrachloride vapor. Commercial hydrogen gas is applied at inlet 12 and passes through flow meter 13 and a series of purifiers consisting of a palladinized Alundum holder 14 and a trap 15 filled with molecular sieves immersed in a reservoir of liquid nitrogen 16. Silicon tetrachloride vapor is supplied from a flask 17 of liquid silicon tetrachloride submerged in a reservoir 18 of liquid nitrogen. The semiconductor slice 19 rests in a cup-shaped silicon pedestal 20 supported in a quartz holder 21, which in turn is held in a vertical position at the bottom closure cap 22. The pedestal 20 is provided with a low resistivity insert 23 for the necessary coupling to the radio frequency coil 24 which surrounds quartz tube 11. A water supply 25 provides a water curtain for cooling the outside of tube 11 to minimize contamination and to prevent deposition of silicon on the inside of the tube walls. The control and measurement of the gas flows are provided by means of conventional valves 27 and stopcocks 28. The vapor pressure of silicon tetrachloride is controlled by regulating the degree of refrigeration of flask 17 in which the hydrogen gas is saturated. The flask 26, immersed in liquid nitrogen, constitutes an outlet condenser for trapping silicon tetrachloride.

As shown in FIG. 2, the original substrate material may be considered to be a single crystal silicon wafer substantially of rectangular form, approximately 250 mils square and 20 mils thick of n type conductivity material having a resistivity of .001 ohm-centimeters. The upper surface 30 of the original slice is carefully polished, etched and cleaned to the end that it is a substantially undamaged crystal surface upon which the epitaxial growth occurs.

The slice with the surface thus prepared is mounted on the pedestal 20 of the apparatus of FIG. 1 and inserted within the tube 11. The apparatus is then arranged to initially provide a flow of pure dry hydrogen alone through the tube 11 and the temperature of the slice is raised to about 1290° C. by energizing the radio frequency coil 24. This treatment is continued for a short period, typically 30 minutes, to eliminate residual surface oxygen prior to commencement of film growth.

Next, following the heat treatment, the slice substrate is brought to a temperature of 1265° C. and the valves are set so as to introduce hydrogen saturated with the silicon tetrachloride vapor to the tube 11. Typically, the ratio of silicon tetrachloride vapor to hydrogen gas is about 0.02, but may be in the range from fractions of one percent to about two percent, depending on the temperature of the reaction and time and flow rates. It will be understood that the rate of film growth is responsive to duration and temperature of the process. Generally, film growth can be carried out at temperatures in the range of 850° C. to 1400° C. and for periods extending from minutes to hours. For the longer reactions the lower temperature range is desirable to inhibit diffuusion of impurities from the substrate into the epitaxial film. These parameters determine the final film thickness.

The film produced on the upper surface of the wafer is of high quality single crystal material having the same orientation as the slice substrate. The thickness of the film is then measured in accordance with the inventive technique discussed herein by inserting the sample in a single beam spectrometer and reflecting a beam of infrared radiation from the surface, varying the wavelength of the radiation and observing maxima and minima in the reflected intensity.

The practice of the invention is best described, however, by the following examples. These examples serve to illustrate two methods of practicing the invention and are not intended as limitations on the scope of the invention.

*Example 1*

A p-type silicon substrate with a carrier concentration of approximately $8\times10^{-19}$ cm.$^{-3}$ was placed in the sample mount of a single beam spectrometer and irradiated with infrared radiation. By referring to FIG. 3 which shows the percent reflection at various wavelengths for this sample, it can be seen that the fringes start at approximately 15$\mu$ and the maxima and minima are observed as shown in FIG. 3. It was then calculated from Equation 3 that the layer thickness was 7.6$\pm$0.3$\mu$. In a control run the layer thickness was estimated by angle-lapping and staining to be 7.3$\mu$.

*Example 2*

The procedure of Example 1 was repeated employing a p-type germanium substrate having a carrier concentration of $4\times10^{-19}$ cm.$^{-3}$. The fringes appear at approximately 12$\mu$ and the maxima and minima are seen on FIG. 4. It was then calculated from Equation 3 that the layer thickness was $13.6 \pm 0.2\mu$. In this case the staining techniques did not clearly delineate the junction.

The lower limit on the thickness of layers which can be measured by this method depends upon the semiconductor material since the free carrier contribution to the susceptibility is inversely proportional to the carrier effective mass. For example, the minimum measurable thickness in germanium or silicon for an n-type, $n=5\times 10^{19}$ cm.$^3$, is approximately $1\mu$. Similar considerations apply to other materials.

The methods disclosed herein are completely non-destructive and can be applied without disturbing the epitaxially grown surface in any way. Thus, each individual wafer can be measured and the diffusion process tailored to the individual layer thickness. Furthermore, the novel technique may be applied to any lightly doped layer grown on any heavily doped substrate, irrespective of the conductivity type of the layer or substrate. It may also be applied to a heavily doped layer on a lightly doped substrate, assuming the absorption in the heavily doped layer is not too great, that is where the product of $\alpha x$ is less than 1, where $\alpha$=the absorption coefficient and $x$= the thickness of the material in compatible units. In this case, Equation 3 locates maxima in the reflected intensity.

It will be appreciated by those skilled in the art that the method may be automated by using an automatic scanning spectrometer and monitoring the detector by ordinary recording methods, such as by use of an oscillograph or a pulse height analyzer which can discriminate between the maxima and minima of the reflected radiation.

It will also be understood that the novel method may be adapted to measuring layer thickness during the epitaxial growth process. In this case, one would use modulated infrared in order to discriminate from the high background of infrared produced by the fact that the growth process is performed at temperatures between 1000 to 1200° C. One must also design the growth chamber with a window which is transparent to infrared and which is also sufficiently cool so that no silicon is deposited upon it. In this case, the growth process may be monitored and by applying appropriate feedback growth may be automatically discontinued when the desired thickness is achieved.

While the invention has been described in detail in the foregoing explanation and the drawing similarly illustrates the same, the aforesaid is by way of illustration only and is not restrictive to character. The several modifications which will readily suggest themselves to persons skilled in the art are all considered within the scope of this invention, reference being had to the appended claims.

What is claimed is:

1. A method for determining the thickness of epitaxially grown films which comprises the steps of placing a substrate of a crystalline semiconductor material having deposited thereon an epitaxial layer of said semiconductor material of differing resistivity, in a sample mount, irradiating said semiconductor material with a series of monochromatic infrared beams whereby interference fringes appear due to the establishment of an optical interface between the substrate and the epitaxial layer, and calculating the thickness of said film from the equation:

$$t=\frac{\lambda}{2\eta}p$$

where $t$ is the thickness of the epitaxial layer, $\lambda$=the wavelength in free space of the infrared radiations, $\eta$= the refractive index of the epitaxial layer and $p$=an integer.

2. The method according to the procedure of claim 1 wherein said semiconductor material is a silicon wafer.

3. The method according to the procedure of claim 1 wherein said semiconductor material is a germanium wafer.

4. A method for determining the thickness of epitaxially grown films which comprises the steps of placing a substrate of single crystal semiconductor material having deposited thereon an epitaxial layer of said semiconductor material of a resistivity different from that of the substrate, in a sample mount, irradiating said semiconductor material with a series of monochromatic infrared beams of varying wavelengths within the range of 1 to 30 microns whereby interference fringes will appear due to the establishment of an optical interface between the substrate and the epitaxial layer, and calculating the thickness of said film from the equation:

$$t=\frac{\lambda}{2\eta}p$$

where $t$ is the thickness of the epitaxial layer, $\lambda$=the wavelength in free space of the infrared radiation, $\eta$=the refractive index of the epitaxial layer and $p$=an integer.

5. The method according to the procedure of claim 4 wherein said semiconductor material is a silicon wafer.

6. The method according to the procedure of claim 4 wherein said semiconductor material is a germanium wafer.

7. A method for controlling the thickness of an epitaxial film comprising the steps of preparing a substrate of a crystalline semiconductor material, growing on said substrate an epitaxial layer of said semiconductor material having a resistivity different from that of the substrate, the said epitaxial layer being of indeterminate thickness, placing said substrate in a sample mount, irradiating said semiconductor material with a series of monochromatic infrared beams whereby interference fringes will appear due to the establishment of an optical interface between the substrate and the epitaxial layer, calculating the thickness of said film from the equation:

$$t=\frac{\lambda}{2\eta}p$$

where $t$ is the thickness of the epitaxial layer, $\lambda$=the wavelength in free space of the infrared radiations, $\eta$=the refractive index of the epitaxial layer and $p$=an integer, and continuing epitaxial growth until the desired thickness is obtained.

8. The method according to the procedure of claim 7 wherein said semiconductor material is a silicon wafer.

9. The method according to the procedure of claim 7 wherein said semiconductor material is a germanium wafer.

References Cited in the file of this patent

UNITED STATES PATENTS

| | | |
|---|---|---|
| 2,726,173 | Martin | Dec. 6, 1955 |
| 2,898,248 | Silvey et al. | Aug. 4, 1959 |

OTHER REFERENCES

"Holland" Vacuum Deposition of Thin Films, 1956, pp. 224–228 relied on. John Wiley & Sons Inc., N.Y.

Spitzer et al.: "Physical Review," volume 106, pages 882–892, 1957, QC 1 P4.